United States Patent
Webb (10) Patent No.: US 8,212,572 B2
(45) Date of Patent: Jul. 3, 2012

(54) ELECTROMAGNETIC COMPATIBILITY MULTI-CARRIER IMMUNITY TESTING SYSTEM AND METHOD

(75) Inventor: Patrick W. Webb, Round Rock, TX (US)

(73) Assignee: National Instruments Corporation, Austin, TX (US)

( * ) Notice: Subject to any disclaimer, the term of this patent is extended or adjusted under 35 U.S.C. 154(b) by 504 days.

(21) Appl. No.: 12/506,684

(22) Filed: Jul. 21, 2009

(65) Prior Publication Data

US 2011/0018553 A1     Jan. 27, 2011

(51) Int. Cl.
*G01R 27/28* (2006.01)
(52) U.S. Cl. .......................... 324/627; 324/612
(58) Field of Classification Search .......... 324/612, 324/600, 627, 628, 637, 638, 639, 96, 501, 324/76.11, 500, 537, 750.01, 750.03, 750.12, 324/144

See application file for complete search history.

(56) References Cited

U.S. PATENT DOCUMENTS

| | | | |
|---|---|---|---|
| 5,514,971 A * | 5/1996 | Hankui et al. | ................. 324/639 |
| 5,995,914 A | 11/1999 | Cabot | |
| 6,509,742 B1 | 1/2003 | Ebizuka et al. | |
| 6,549,019 B2 * | 4/2003 | Nielsen | ......................... 324/628 |
| 6,795,030 B2 * | 9/2004 | Klingler et al. | ................ 343/703 |
| 7,741,856 B2 * | 6/2010 | Sugiura | ......................... 324/627 |
| 2006/0255998 A1 | 11/2006 | Hirata et al. | |
| 2006/0267597 A1 | 11/2006 | Sugiura | |

OTHER PUBLICATIONS

"International Standard IEC61000-4-3." Edition 2.1, Ref. No. CEI/IEC 61000-4-3:2002+A1:2002, Sep. 2002. (116 pages).
"International Standard IEC61000-4-6." Second Edition, Ref. No. CEI/IEC 61000-4-6:2003, May 2003. (102 pages).
"RF Immunity Testing: a handy guide." Dated 2001. (46 pages).
"Forward and Reflected Powers. What Do They Mean?." Richard A. Scholl, Dated 1998. (4 pages).

* cited by examiner

*Primary Examiner* — Hoai-An D Nguyen
(74) *Attorney, Agent, or Firm* — Meyertons Hood Kivlin Kowert & Goetzel, P.C.; Jeffrey C. Hood (57) ABSTRACT

Provided for in some embodiments is, a method of electromagnetic compatibility multi-carrier immunity testing. The method includes generating a first carrier frequency set including a first plurality of carrier frequencies simultaneously such that a device under test is subjected to the first plurality of carrier frequencies simultaneously. One or more of the first plurality of carrier frequencies is substantially different from other ones of the first plurality of carrier frequencies such that the first plurality of carrier frequencies do not interfere with one another when they are generated simultaneously, and intermodulation products of the first plurality of carrier frequencies are not significant relative to the first plurality of carrier frequencies when the first plurality of carrier frequencies are generated simultaneously.

20 Claims, 5 Drawing Sheets

ELECTROMAGNETIC COMPATIBILITY MULTI-CARRIER IMMUNITY TESTING SYSTEM AND METHOD

BACKGROUND

1. Field of the Invention

The present invention relates to electromagnetic compatibility (EMC) immunity testing, and more particularly to electromagnetic compatibility (EMC) immunity testing using multiple carrier frequencies simultaneously.

2. Description of the Related Art

Radio frequency (RF) signals are becoming increasing more prevalent in our environment. Often RF signals are generated by electronic devices, such as radio and cellular communication devices. As a result, most devices are expected to operate in these environments despite being subjected to various radio frequency (RF) signals. To help design for use in these environments, electronic devices are typically subjected to tests that that replicate these environmental conditions in an attempt to identify compatibility issues and improve performance. For instance, devices may be required to undergo electromagnetic compatibility (EMC) immunity test to verify operation of the device while it is exposed to signals that may create electromagnetic interference (EMI).

Electromagnetic compatibility testing (EMC) and similar testing techniques typically include subjecting a device under test (DUT) to a sweep of test signals in a given frequency range. The frequency range may be exemplary of signals that the device is expected to encounter during use. During testing, a DUT may be isolated in a test chamber and subjected to a sweep through a series of carrier frequencies, one at a time, across the given frequency range. During the sweep through each carrier frequency, the DUT may be monitored to determine whether or not each of the frequencies affects the DUT's operation. A particular sweep may include subjecting the DUT to several hundred individual carrier frequencies in series, one at a time. In some instances, the DUT may be subjected to a sweep of 255 carrier frequencies within a range of about 80 Mega-hertz (MHz) to about 1 Giga-hertz (GHz). Unfortunately, sweeping through multiple frequencies in series, one at a time, can take a considerable amount of time, resulting in increased cost, as well as delays in design, testing and production.

Thus, improved systems and methods for electromagnetic compatibility (EMC) immunity testing are desired.

SUMMARY OF THE INVENTION

The following describes various systems and methods for electromagnetic compatibility multi-carrier testing. In one embodiment, provided is a method of electromagnetic compatibility multi-carrier immunity testing. The method includes generating a first carrier frequency set including a first plurality of carrier frequencies simultaneously such that a device under test is subjected to the first plurality of carrier frequencies simultaneously. One or more of the first plurality of carrier frequencies is substantially different from other ones of the first plurality of carrier frequencies such that the first plurality of carrier frequencies do not interfere with one another when they are generated simultaneously. Further, intermodulation products of the first plurality of carrier frequencies are not significant relative to the first plurality of carrier frequencies when the first plurality of carrier frequencies are generated simultaneously.

In another embodiment, provided is a memory storage medium having program instructions for performing electromagnetic compatibility multi-carrier immunity testing stored thereon, wherein the program instructions are executable to implement generating a first plurality of carrier frequencies simultaneously such that a device under test is subjected to the first plurality of carrier frequencies simultaneously. One or more of the plurality of carrier frequencies is substantially different from other ones of the first plurality of carrier frequencies such that the first plurality of carrier frequencies do not interfere with one another when they are generated simultaneously, and intermodulation products of the first plurality of carrier frequencies are not significant relative to the first plurality of carrier frequencies when the first plurality of carrier frequencies are generated simultaneously.

In yet another embodiment, provided is a electromagnetic immunity testing system that includes a generator configured to subject a device under test to a plurality of carrier frequencies simultaneously, wherein quarter-wavelengths of one or more of the plurality of carrier frequencies is substantially different from quarter-wavelengths of others of the plurality of carrier frequencies such that the plurality of carrier frequencies do not interfere with one another when they are generated simultaneously, and intermodulation products of the plurality of carrier frequencies are not significant relative to the plurality of carrier frequencies when they are generated simultaneously.

In yet another embodiment, provided is a computer-implemented method of electromagnetic compatibility immunity testing. The method includes, assessing, by a computer, an initial forward power associated with a first carrier frequency of a plurality of carrier frequencies, wherein the initial forward power is configured to generate a field strength. Assessing, by the computer, a first subset of carrier frequencies of the plurality of carrier frequencies, wherein the first subset comprises the first carrier frequency, the first carrier frequency is substantially different from others ones of the first plurality of carrier frequencies of the first subset such that the plurality of carrier frequencies of the first subset do not interfere with one another when the plurality of carrier frequencies of the first subset are generated simultaneously, and intermodulation products of the first plurality of carrier frequencies of the first subset are not significant relative to the plurality of carrier frequencies of the first subset when the plurality of carrier frequencies of the first subset are generated simultaneously. The method also includes assessing, by the computer, a first adjusted drive level for the first carrier frequency, wherein assessing the adjusted drive level for the first carrier frequency includes generating the first subset of carrier frequencies simultaneously and adjusting a drive level associated with the first carrier frequency to an first adjusted drive level configured generate the initial forward power associated with a first carrier frequency. The method also includes generating the first subset of carrier frequencies simultaneously. Generating the first subset of carrier frequencies simultaneously includes generating the first carrier frequency using the first adjusted drive level to perform electromagnetic compatibility immunity testing of a device under test.

BRIEF DESCRIPTION OF THE DRAWINGS

A better understanding of the present invention can be obtained when the following detailed description of the preferred embodiment is considered in conjunction with the following drawings, in which.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE EMBODIMENTS

The following is a glossary of terms used in the present application:

Computer System—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" can be broadly defined to encompass any device (or combination of devices) having at least one processor that executes instructions from a memory medium.

Measurement Device—includes instruments, data acquisition devices, smart sensors, and any of various types of devices that are operable to acquire and/or store data. A measurement device may also optionally be further operable to analyze or process the acquired or stored data. Examples of a measurement device include an instrument, such as a traditional stand-alone "box" instrument, a computer-based instrument (instrument on a card) or external instrument, a data acquisition card, a device external to a computer that operates similarly to a data acquisition card, a smart sensor, one or more DAQ or measurement cards or modules in a chassis, an image acquisition device, such as an image acquisition (or machine vision) card (also called a video capture board) or smart camera, a motion control device, a robot having machine vision, and other similar types of devices. Exemplary "stand-alone" instruments include oscilloscopes, multimeters, signal analyzers, arbitrary waveform generators, spectroscopes, and similar measurement, test, or automation instruments.

A measurement device may be further operable to perform control functions, e.g., in response to analysis of the acquired or stored data. For example, the measurement device may send a control signal to an external system, such as a motion control system or to a sensor, in response to particular data. A measurement device may also be operable to perform automation functions, i.e., may receive and analyze data, and issue automation control signals in response.

Subset—in a set having N elements, the term "subset" comprises any combination of one or more of the elements, up to and including the full set of N elements. For example, a subset of a plurality of signal may be any one signal of the plurality of the signals, any combination of one or more of the signals, or all of the signals in the plurality of signals. Thus, a subset of an entity may refer to any single element of the entity as well as any portion up to and including the entirety of the entity.

Figure 1A:
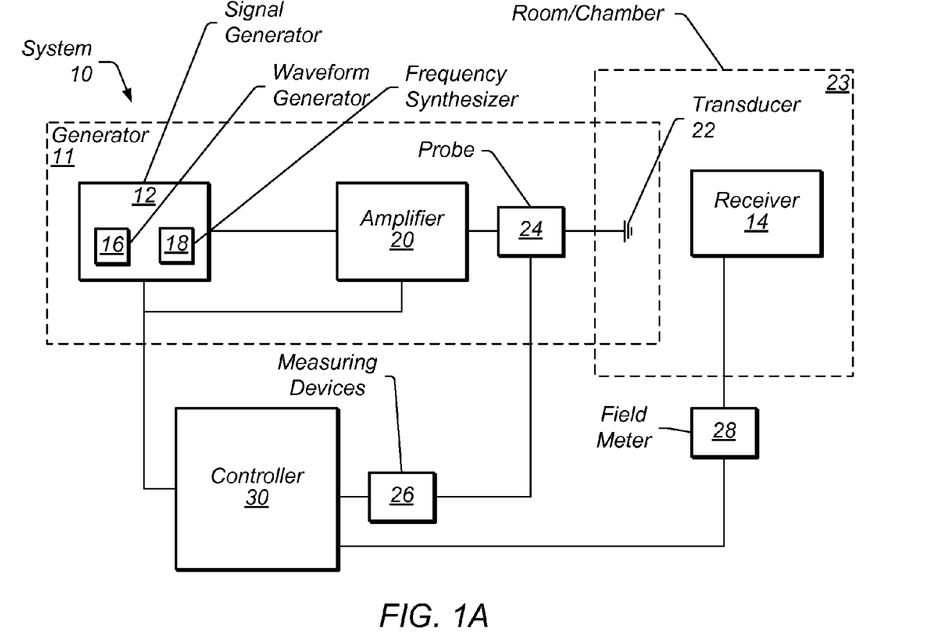
FIGS. 1A and 1B illustrate systems for performing electromagnetic immunity testing in accordance with one or more embodiments of the present invention.
Figure 1B:
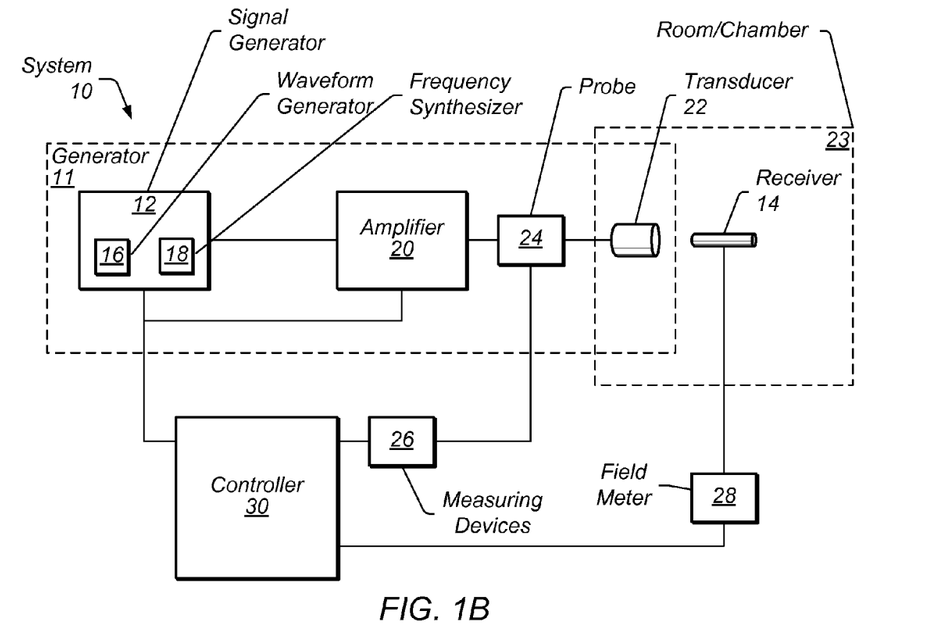

FIGS. 1A and 1B illustrate embodiments of a system 10 configured to implement electromagnetic compatibility (EMC) multi-carrier immunity testing. Embodiments of a method for electromagnetic compatibility (EMC) multi-carrier immunity testing are described below.

As depicted in FIG. 1A, in some embodiments, the system 10 includes a generator 11 and a receiver 14. The generator 11 may be used to generate and/or transmit signals that are received at the receiver 14. For example, the generator 11 may include a signal generation device that provides test signals and the receiver 14 may include a device under test (DUT) that is subjected or otherwise receives the test signals.

In one embodiment, generator 11 is capable of providing signals used in electromagnetic compatibility (EMC) testing. For example, in one embodiment, generator 11 may be capable of generating and transmitting various carrier signals that a DUT is ultimately subjected to during EMC testing. In the embodiment illustrated of FIG. 1A, generator 11 includes a device capable of providing signals used for radiated radio-frequency (RF) immunity tests. Radiated RF immunity testing may require that the generator 11 generate RF fields of one or more carrier frequencies, referred to hereafter as "test frequencies." For example, the generator 11 may provide an RF field sweep in a range of 80 MHz to 1000 MHz. As described in more detail below, the generator 11 may be capable of providing a plurality of test frequencies simultaneously.

In the illustrated embodiment, the generator 11 includes signal generator 12, an amplifier 20, and a transducer 22. In one embodiment, the signal generator 12 includes a waveform generator 16 and a frequency synthesizer 18. Waveform generator 16 may include a device, such as an arbitrary waveform generator, that is capable of producing a signal of a given waveform type and frequency. In one embodiment, frequency synthesizer 18 may include a device for generating any of a range of frequencies from a single fixed timebase or oscillator, such as an upconverter capable of modulating the output of the waveform generator 16 with a carrier frequency. For example, in one embodiment, such as those in which generator 11 provides an RF field, the signal generator 16 may provide a base signal, such as 1 kHz sine or cosine wave, that is input to the frequency synthesizer 18, and the frequency synthesizer 18 may modulate the signal onto an RF carrier signal of a given frequency, such as a carrier signal having a frequency in the range of about 80 MHz to about 1 GHz. Although a base signal including a 1 kHz wave may be used in certain embodiments, other frequencies may be used. For example, the base signal may include another frequency, or a different waveform altogether. Further, although carrier frequencies in the range of about 80 MHz to about 1 GHz may be used in certain embodiments, other embodiments may include various frequencies, ranges of frequencies, and various sweeps through frequency ranges. In one embodiment, the frequency synthesizer 18 may be capable of generating carrier signals within the range from about 40 MHz to about 300 Ghz.

In the illustrated embodiment, an output of the frequency synthesizer 18 is provided to an input to the amplifier 20. Amplifier 20 may include a power amplifier that is capable of providing a signal of sufficient output power at the frequency of the input. For example, the amplifier 20 may amplify the signal power such that it is capable of driving a signal to be transmitted by the transducer 22, e.g., an antenna. In an embodiment in which more than one frequency is output by the generator 11, such as during a frequency sweep provided during EMC testing, the amplifier 20 may be capable of providing the desired power output over the entire frequency range of the test. As discussed in more detail below, the amplifier 20 may be capable of providing enough power to drive multiple signals simultaneously at a desired power level.

In the illustrated embodiment, an output signal of the amplifier 20 is provided to the transducer 22. Transducer 22 may include a device that is capable of transmitting the amplified signal such that it may be received by the receiver 14. In one embodiment, transducer 22 may include antenna, such as a broadband antenna. In some embodiments, the transducer 22 may be positioned such that the signals are generated in particular orientation. For example, during ENC testing, an antenna transducer 22 and/or the receiver 14 (e.g., a device under test) may be positioned such that the signals are transmitted and/or received in a particular direction relative to the DUT. In one embodiment, the transducer 22 and the receiver 14 are both positioned in an anechoic room/chamber 23, such as those typically used for electromagnetic immunity testing.

In one embodiment, the receiver 14 may include one or more devices that receive/sense/detect or are otherwise subjected to the signals provided by the generator 11. During EMC testing, for instance, receiver 14 may include a device under test (DUT), such as a computer, cable, or similar electronic device, that is subjected to the generated sweep of test signals. In one embodiment, receiver 14 may include a broadband antenna, a field probe, or similar receiving device that is capable of sensing the signals transmitted by generator 11. A broadband antenna may include an antenna capable of measuring both magnitude and orientation of a field associated with a received signal. A field probe may include an isotropic probe that is capable of measuring magnitude of a field irrespective of the direction of the field or the orientation of the field probe. In one embodiment, a field probe measures field in each of three orthogonal directions and provides a measurement based on their vector sum in all of the directions.

In one embodiment, a plurality of the receivers 14 may be provided. For example, a plurality of the receivers 14 may be exchanged throughout EMC testing. For example, during calibration, the receiver 14 may include a field probe, broadband antenna, and/or an oscilloscope, and during testing, the receiver 14 may include the DUT. In some embodiments, multiple receivers 14 may be provided simultaneously. For example, one or more antennas and/or probes may be positioned in the chamber during calibration, and the antennas and/or probes may remain in the test area while the DUT is being tested. The additional receivers 14 may be used for calibration, validation, and similar assessments.

In some embodiments, the system 10 may include devices for the measurement and control of various aspects of the immunity test and test system. In one embodiment, devices may be provided to measure forward power associated with generated RF fields, drive levels, and/or the signature of the RF field at a test location. For example, in the illustrated embodiment, a probe 24 (e.g., directional coupler) is provided in-line between the amplifier 20 and the transducer 22, and is coupled to measuring devices 26 (e.g., a spectrum analyzer or power meter). The probe 24 may enable measuring device 26 to measure a forward power between the amplifier 20 and the transducer 22. In one embodiment, a field meter 28 (e.g., a spectrum analyzer or power meter) may be coupled to the transducer 22, as depicted. The field meter 28 may be capable of measuring characteristics (e.g., field strength, frequency, and/or orientation) of the RF field at the receiver 14.

In certain embodiments, system 10 and its associated devices may be controlled manually by an operator, automatically by a controller, or a combination thereof. For example, during manual operation, an operator may make necessary adjustments to the generator 11 to ensure that it is providing a signal at a given frequency and power. In one embodiment, a controller may be provided to control and/or monitor operation of various components of system 10. For example, in the illustrated embodiment, a controller 30 is coupled to the generator 11 and the receiver 14. In one embodiment, the controller 30 may include a computer system (e.g., a personal computer) that regulates and monitors at least a portion of their operation. For example, in the illustrated embodiment, controller 30 may communicate with the signal generator 12, the amplifier 20, measuring instruments 26 and/or field meter 28 to control and monitor various aspects of system 10. For example, the controller may execute operations in accordance with stored routines or other inputs (e.g., user input) to manipulate operation of the signal generator 12 and the amplifier 20, and to monitor feedback from the measuring instruments 26 and field meter 28. Such an embodiment may enable system 10 to operate in a closed loop.

In one embodiment, controller 30 may be provided as a one or more stand alone units that interface with portions of the signal generator 12 and/or the receiver 14, as depicted in FIG. 1A. In one embodiment, one or more controllers may be provided integral with one or more portions of the signal generator 12 and/or the receiver 14. For example, the signal generator 12 and/or the receiver 14 may include an integral computer system that controls at least a portion of their operation. Such a computer system may be used to control various parameters of signals provided by signal generator 12 and/or may be used to assess signals received by the receiver 14. Embodiments of the controller 30 are discussed in more detail below.

As depicted in FIG. 1B, in one embodiment, signal generator 12 may include a device that provides signals used for conducted radio-frequency (RF) immunity tests. Conducted RF immunity testing may be well suited for lower frequency signals that are note efficiently and reliably transmitted through the air, for instance. Similar to radiated RF immunity testing, conducted RF immunity testing may require the signal generator 12 provide RF fields of various frequencies. For example, the signal generator 14 may generate an RF filed sweep in a range from about 150 kHz to 80 MHz.

Due to the low frequency of test signals that may be associated with conducted RF immunity test, a generated signal may be provided from the signal generator 16 to the transducer 22 with little to no manipulation. For example, in the illustrated embodiment, a test signal output from the signal generator 16 may be routed directly to transducer 22. In such an embodiment, signal generator 12 may not include, or at least may not make use of, a frequency synthesizer and/or an amplifier. In one embodiment, the signal output by the signal generator 16 may be routed to amplifier 20 before the transducer 22, but may not pass through a frequency synthesizer.

In the illustrated embodiment, the signal generator 12 may include a transducer that couples to the receiver 14 (e.g., the device under test). A transducer coupled to the receiver 14 may be well suited for conducted RF immunity testing. In one embodiment, the transducer 22 includes an inductive and/or capacitive coupling to the device under test. For example, transducer 22 may include a clamp that is secured about a portion of a cable under test to provide inductive and/or capacitive coupling. In one embodiment, transducer 22 may include a current injection probe. A current injection probe may provide inductive coupling without capacitive coupling.

Figure 2A:
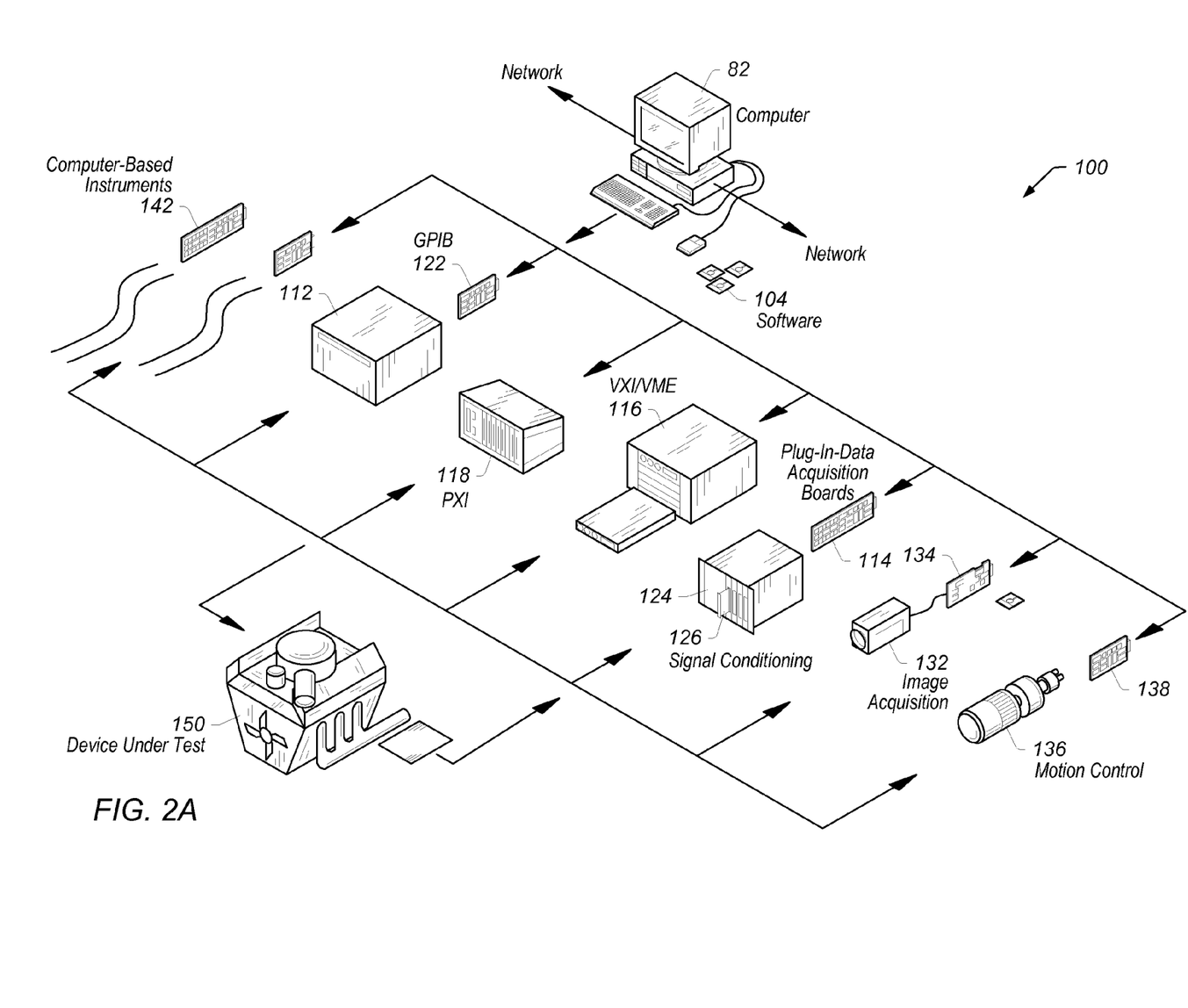
FIG. 2A is a high-level block diagram of an exemplary system that may execute or utilize programs in accordance with one or more embodiments of the present invention.
Figure 2B:
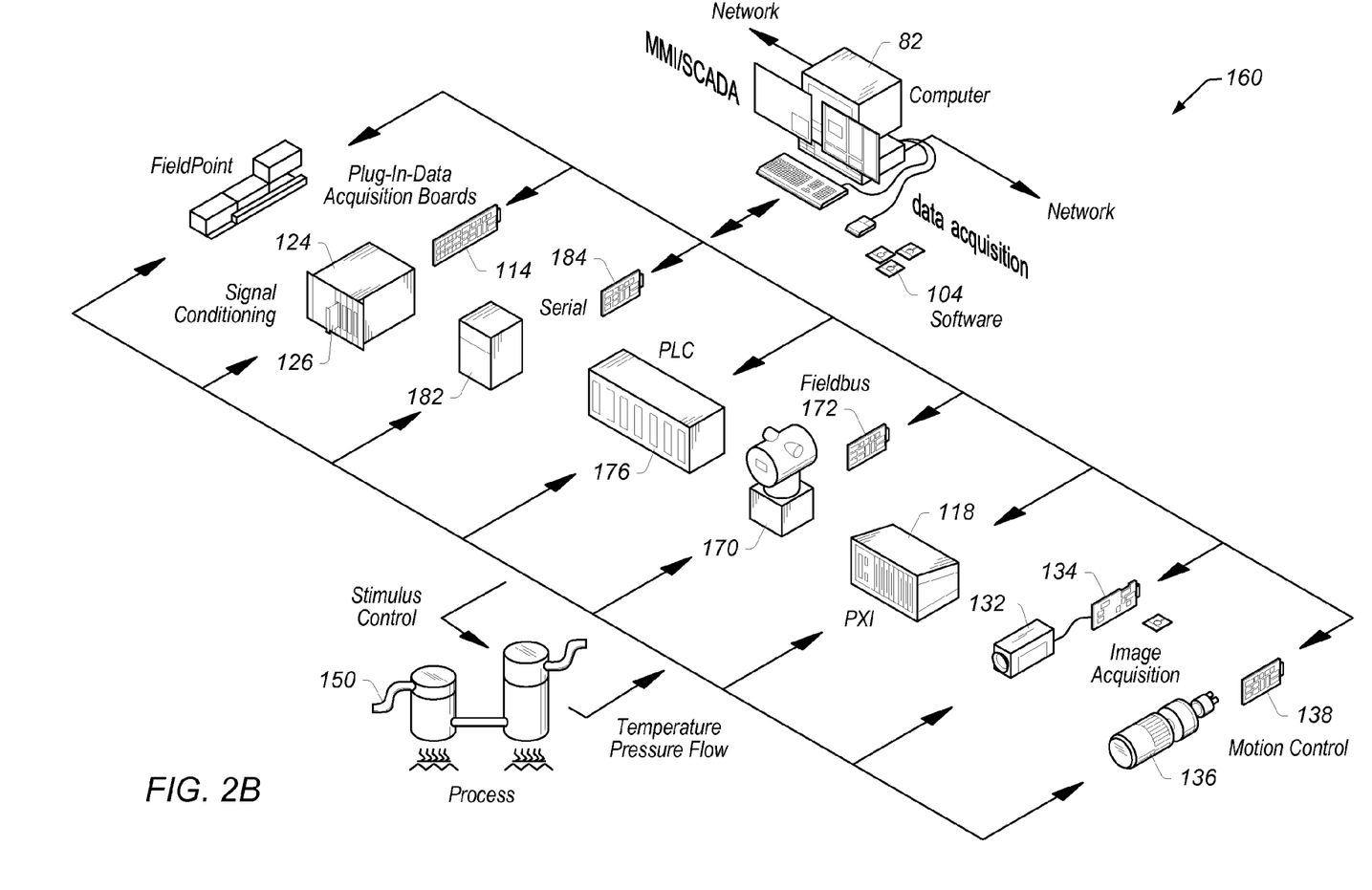
FIG. 2B illustrates an exemplary system that may perform functions in accordance with one or more embodiments of the present invention.

In one embodiment, system 10 may include a computer system used to control, monitor, regulate, or otherwise interact with system 10. For example, in one embodiment, controller 30 may include a personal computer (PC) system. FIGS. 2A and 2B depict exemplary embodiments of a computer system 82 in accordance with one or more embodiments of the present invention. The computer system 82 may be analogous to one or more portions of controller 30. In one embodiment, the computer system 82 may include a display device operable to display a graphical user interface for implementing and using embodiments of the present invention. The computer system 82 may include one or more memory mediums on which one or more computer programs or software components according to one or more embodiments of the present invention may be stored. For example, the memory medium may store one or more programs, e.g., graphical programs, which are executable to perform the methods described herein. Also, the memory medium may store a programming development environment application, e.g., a graphical programming development environment application, used to create and/or execute such programs. For example, in certain embodiments, the programming development environment may facilitate the development of programs that include performance, timing, and I/O constraint information as part of the program. In other words, a programming language provided by the programming development environment may allow such performance, timing, and I/O constraint specifications or criteria to be included in the program itself, e.g., as part of the source code of the program, and/or may be accessed by the program or tools, e.g., profiling tools, to check the program against the criteria, as will be described in more detail below. The memory medium may also store operating system software, as well as other software for operation of the computer system. Various embodiments may include receiving or storing instructions and/or data implemented in accordance with the foregoing description upon a computer-accessible medium.

In one embodiment, computer system 82 may be coupled to one or more other computer systems. For example, the computer system 82 may be coupled via a network (or a computer bus) to a second computer system. The computer systems may each be any of various types, as desired. The network can also be any of various types, including a LAN (local area network), WAN (wide area network), the Internet, or an Intranet, among others. The computer systems may execute a program in a distributed fashion. For example, computer 82 may execute a first portion of the block diagram of a program and the other computer system may execute a second portion of the program. As another example, computer 82 may display the graphical user interface of a graphical program and the other computer system may execute the block diagram of the graphical program.

FIG. 2A illustrates an exemplary instrumentation control system 100 which may implement embodiments of the invention. The system 100 comprises host computer system 82 that connects to one or more instruments. The host computer system 82 may comprise a CPU, a display screen, memory, and one or more input devices such as a mouse or keyboard as shown. The computer system 82 may operate with the one or more instruments to analyze, measure or control a DUT or process 150. According to embodiments of the present invention, one or more of the instruments and devices of FIG. 2A (and FIG. 2B described below) may include a programmable hardware element (e.g. an FPGA) configured with a processor and/or memory, and may be further configured with one or more portions of user code, as will be described below in more detail.

The one or more instruments may include a GPIB instrument 112 and associated GPIB interface card 122, a data acquisition board 114 and associated signal conditioning circuitry 124, a VXI instrument 116, a PXI instrument 118, a video device or camera 132 and associated image acquisition (or machine vision) card 134, a motion control device 136 and associated motion control interface card 138, and/or one or more computer based instrument cards 142, among other types of devices. The computer system may couple to and operate with one or more of these instruments. The instruments may be coupled to a device under test (DUT) or process 150, or may be coupled to receive field signals, typically generated by transducers. The system 100 may be used in a data acquisition and control application, in a test and measurement application, an image processing or machine vision application, a process control application, a man-machine interface application, a simulation application, or a hardware-in-the-loop validation application, among others.

FIG. 2B illustrates an exemplary industrial automation system 160 that may implement embodiments of the invention. The industrial automation system 160 is similar to the instrumentation or test and measurement system 100 shown in FIG. 2A. Elements which are similar or identical to elements in FIG. 2A have the same reference numerals for convenience. The system 160 may comprise a computer system 82 which connects to one or more devices or instruments. The computer system 82 may comprise a CPU, a display screen, memory, and one or more input devices such as a mouse or keyboard as shown. The computer system 82 may operate with the one or more devices to a process or device 150 to perform an automation function, such as MMI (Man Machine Interface), SCADA (Supervisory Control and Data Acquisition), portable or distributed data acquisition, process control, advanced analysis, or other control, among others.

The one or more devices may include a data acquisition board 114 and associated signal conditioning circuitry 124, a PXI instrument 118, a video device 132 and associated image acquisition card 134, a motion control device 136 and associated motion control interface card 138, a fieldbus device 170 and associated fieldbus interface card 172, a PLC (Programmable Logic Controller) 176, a serial instrument 182 and associated serial interface card 184, or a distributed data acquisition system, such as the Fieldpoint system available from National Instruments Corporation, having headquarters in Austin, Tex., among other types of devices.

Figure 3:
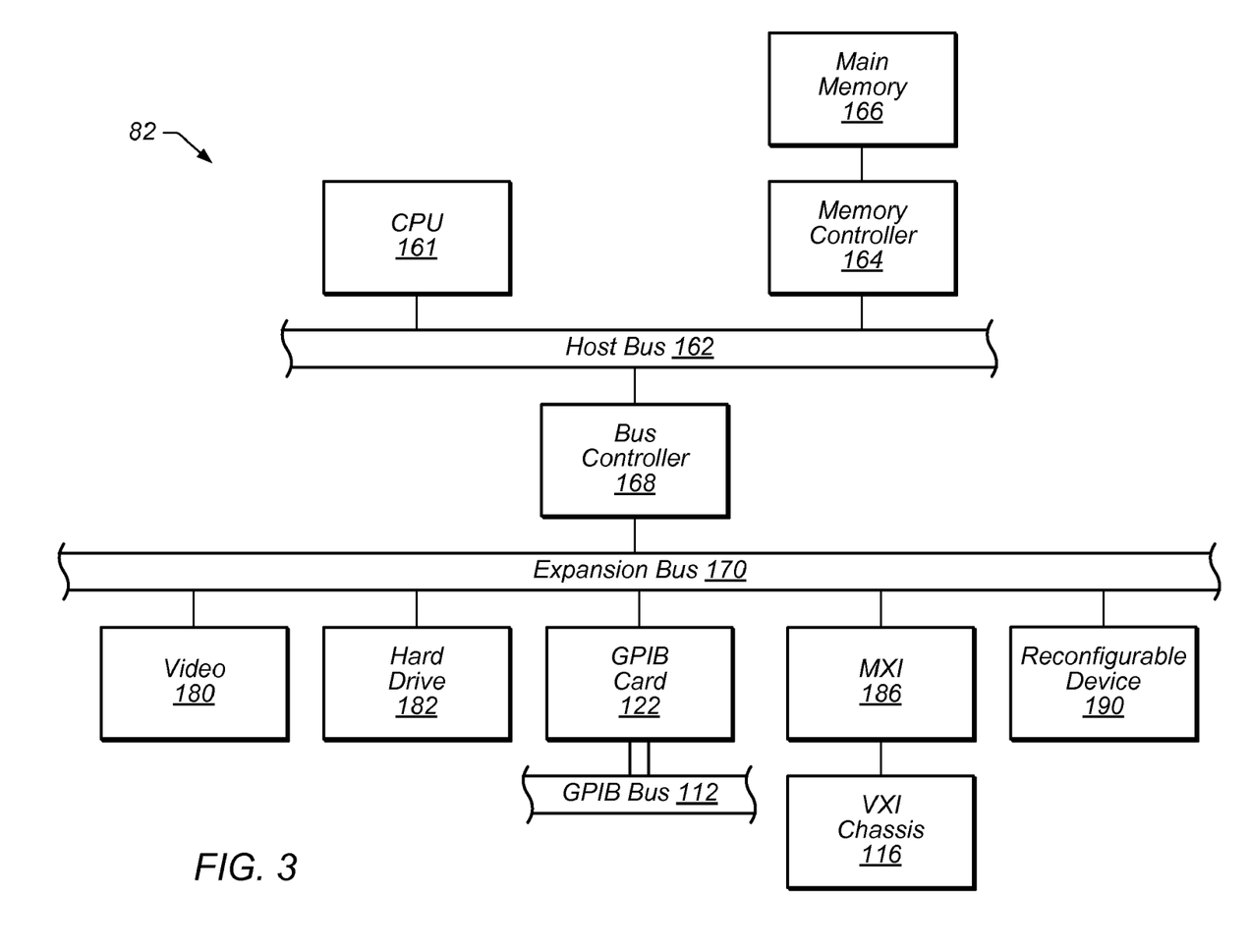
FIG. 3 is an exemplary block diagram of exemplary computer systems of FIGS. 1A-2B in accordance with one or more embodiments of the present invention.
Figure 4:
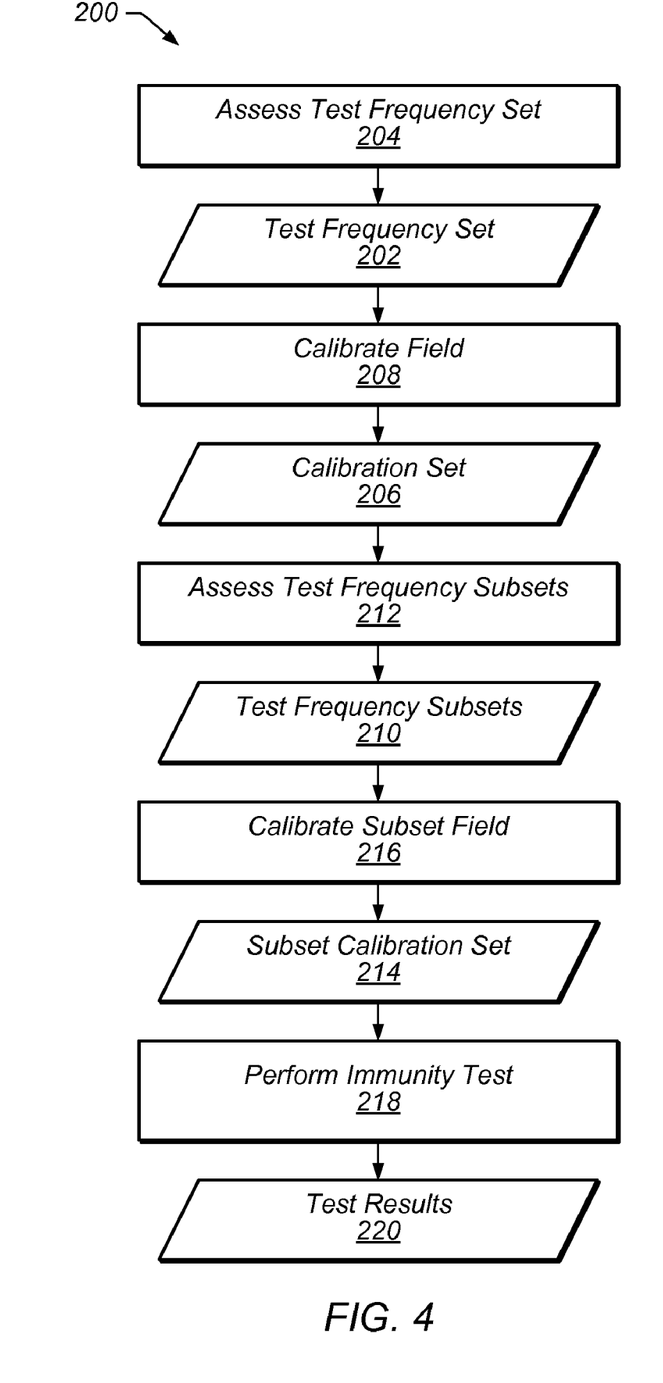
FIG. 4 is a flowchart diagram illustrating one embodiment of a method for performing electromagnetic immunity testing in accordance with one or more embodiments of the present invention.

FIG. 3 is a block diagram representing one embodiment of the computer system 82. It is noted that any type of computer system configuration or architecture can be used as desired, and FIG. 4 illustrates a representative PC embodiment. It is also noted that the computer system 82 may be a general-purpose computer system, a computer implemented on a card installed in a chassis, or other types of embodiments. Certain elements of a computer not necessary to understand the present description have been omitted for simplicity.

The computer system 82 may include at least one central processing unit or CPU (processor) 161 that is coupled to a processor or host bus 162. The CPU 161 may be any of various types, including an x86 processor, e.g., a Pentium class, a PowerPC processor, a CPU from the SPARC family of RISC processors, as well as others. A memory medium, typically comprising RAM and referred to as main memory, 166 is coupled to the host bus 162 by means of memory controller 164. As noted above, the main memory 166 may store a programming development environment, e.g., a graphical programming development environment, as well as one or more programs implementing and/or used in embodiments of the present invention. The main memory 166 may also store operating system software, as well as other software for operation of the computer system 82. The host bus 162 may be coupled to an expansion or input/output bus 170 by means of a bus controller 168 or bus bridge logic. The expansion bus 170 may be the PCI (Peripheral Component Interconnect) expansion bus, although other bus types can be used. The expansion bus 170 includes slots for various devices such as described above. The computer system 82 further comprises a video display subsystem 180 and hard drive 182 coupled to the expansion bus 170. As depicted, a device 190 may also be connected to the computer. The device 190 may include a processor and memory implemented on (e.g., configured on or included in), or coupled to, a programmable hardware element, e.g., an FPGA. The computer system 82 may be operable to deploy a program, e.g., a graphical program, to the device 190 for execution of the program on the device 190, with respective portions of the program possibly implemented on the programmable hardware element, and stored in the memory for execution by the processor. The device may be any of a variety of device types, such as those described above with reference to FIGS. 2A and 2B.

In some embodiments, the deployed program may take the form of program instructions, e.g., graphical instructions, or data structures that directly represent the program. Alternatively, the deployed program (or a portion of the program) may take the form of text code (e.g., "C" code) generated from a graphical program. As another example, the deployed program (or a portion of the program) may take the form of compiled code generated from either the graphical program or from text code that in turn was generated from the graphical program. The computer system 82, e.g., via the programming development environment, may be operable to target, i.e., compile, respective portions of the user code for execution by the processor, and for implementation as hardware on the programmable hardware element, e.g., the FPGA, as needed to meet performance criteria, e.g., resource use, timing, and I/O constraint criteria, and may be further operable to deploy the portions to their respective targets.

FIG. 4 illustrates a method 200 for electromagnetic compatibility (EMC) testing. The method 200 in one embodiment may be implemented using a test system, such as system 10 described above. For example, method 200 may be employed via computer system 82 to implement some or all portions of method 200.

In the exemplary embodiment shown in FIG. 4, illustrated is a method for electromagnetic compatibility (EMC) multi-carrier immunity testing. The method shown in FIG. 5 may be used in conjunction with any of the computer systems or devices described herein, among other devices. In various embodiments, some of the method elements shown may be performed concurrently, in a different order than shown, or may be omitted. Additional method elements may also be performed as desired. As shown, this method may operate as follows. In one embodiment, portions of method 200 may be performed in accordance with certain test standards. For example, in one embodiment, method 200 may be performed in accordance with International Standard IEC61000-4-3 (Ref. No. CEI/IEC 61000-4-3:2002+A1:2002) which is herein incorporated by reference in its entirety, and/or International Standard IEC61000-4-6 (Ref. No. CEI/IEC 61000-4-6:2003) which is herein incorporated by reference in its entirety. Embodiments may employ a similar version of this or another standard, such as current versions of this or another standard at the time of testing.

In one embodiment, method 200 includes providing a test carrier frequency set 202 (hereinafter a test frequency set), based on assessing a test frequency set, as depicted at block 204. In one embodiment, assessing a test frequency set may include assessing a frequency range and one or more test frequencies within that range for a given test. For example, in an embodiment that includes EMC testing, a standard may require that a particular test sweep include a test frequency set of several hundred carrier frequencies, such as testing two-hundred fifty-five carrier frequencies in the range of 80 MHz to 1.0 GHz. Other embodiments may include a test frequency set that includes various other radio frequency (RF) ranges. For example, ranges may include lower frequencies, such as 3 Hz, and higher frequencies, such as those up to 300 GHz. In one embodiment, the number of test frequencies in a given test frequency set may be dictated by the test frequency range and a step size, such as a maximum or minimum step size required by the test standard. For example, a standard may require that a step size is less than 1% of the prior frequency. In an embodiment that includes a sweep in a range from 80 MHz to 1.0 GHz, the test frequency set may include 80.00 MHz, 80.80 MHz, 81.61 MHz, 82.42 MHz, 83.25 MHz, and so forth up to a frequency of 1.0 GHz. In such an embodiment, there may be about two-hundred fifty-five test frequencies, in the range of 80 MHz to 1.0 GHz. In one embodiment, test frequency sets may be dictated by a controlling test standard.

In one embodiment, method 200 includes providing a calibration set 206 based on calibrating the field, as depicted at block 208. Calibrating the field may ensure that the uniformity of the generated field over the test sample is sufficient to ensure the validity of the test results. In other words, calibration of the field may ensure that the DUT is subjected to a field of sufficient power at each carrier frequency during testing. The calibration set 206 may include one or more values, settings, or the like associated with the system based on the calibration of the field. For example, the calibration set 206 may include one or more settings/configurations for the signal generator of the system at each of the test frequencies in the test frequency set 202. In one embodiment, calibrating the field includes calibrating test levels, e.g., forward power levels, for each test frequency of the test frequency set 202. In one embodiment, each frequency is generated individually (e.g., one at a time) and the associated forward power level and associated settings for the system are recorded. For example, in one embodiment, a probe (e.g., a field probe or current probe) is placed in the test setup at or near a location where the DUT will be located during testing. The signal generator is operated to generate a field at one of the test frequencies, settings of the signal generator are adjusted until the required field strength measured by the probe is in accordance with the standards, and a forward power level of the signal generator associated with the generated/required field strength is recorded. These steps may be repeated for each test frequency of the test frequency set 202. In one embodiment, the forward power may be measured at an input of the transducer of the signal generator. For example, the forward power may be measured at the probe between the output of the amplifier and the input to the transducer (e.g., antenna) of the signal generator. As discussed in more detail below, the forward power may be referenced at a later time to fine tune the signal generator as various components of the system are exchanged.

In one embodiment, calibrating the field (block 208) may include measuring the field strength using another type of a receiver, such as a broadband antenna or a current probe. For example, in an embodiment that includes radiated immunity testing, a broadband antenna may be placed in the test setup at or near a location where the DUT will be located during testing. In an embodiment that includes conducted immunity testing, a current probe may be placed in the test setup in a similar manner as the DUT will be during testing such that it can detect the resulting injected current. For either of radiated or conducted immunity testing, as the signal generator is operated to generate a field/injection current at one of the test frequencies, and settings of the signal generator are adjusted until the required field strength/injected current measured by the receiver is in accordance with the standards, and the field signature (e.g., field strength in multiple direction sensed by the broadband antenna) is recorded. These steps may be repeated for each test frequency of the test frequency set 202. In one embodiment, the forward power and the respective field strengths and/or injection current associated with each of test frequencies may be provided in the calibration set 206.

In one embodiment of the radiated immunity test, a broadband antenna may record the field signature simultaneous with the use of the field probe. In another embodiment, the field probe may be removed, the broadband antenna installed, and the signal generator may be cycled through the test frequency set 202 based on the settings derived while using the field probe (e.g., the forward power levels and associated settings), and the field signature is recorded for each respective test frequency of the test frequency set 202. In one embodiment, the field signatures may be included in the calibration set. The field signatures may be referenced to verify certain aspects of the system operation at a later time, as discussed in more detail below.

In the illustrated embodiment, method 200 includes assessing test frequency subsets 210, as depicted at block 212. In one embodiment, assessing test frequency subsets includes reviewing the test frequency set to determine if one or more of the test frequencies within the set can be generated simultaneously. In other words, can two or more of the test frequencies be generated at the same time instead of being generated separately, one by one. Each of the test frequency subsets 210 may include one or several of the test frequencies of the test frequency set 202. In one embodiment, assessing the test frequency subsets may include considerations of one or more conditions to determine whether or not two or more carrier frequencies of the test frequency set should be included in the same subset.

In one embodiment, the signal generator must be capable of generating all of the test frequencies in the test frequency subset simultaneously. Thus, in an embodiment of the signal generator that includes a signal generator (e.g., a vector signal generator) and/or upconverter (e.g., frequency synthesizer) they must be able to generate all carriers of the test frequency subset 210 simultaneously. For example, for a given test frequency subset, the components of the signal generator must be capable of handing the bandwidth associated with the test frequency subset. For example, in an embodiment that includes radiated immunity testing, the bandwidth of the frequency synthesizer, the amplifier (e.g., a broadband amplifier), and the transducer (e.g., a broadband antenna) must be equal to or greater than the difference in frequency between the lowest and highest frequency test signals in the test frequency subset. Further, each of the components (e.g., the frequency synthesizer) must be capable of accurately representing the test frequencies of the test frequency subset simultaneously, with and without modulation. Similar consideration may exists for conducting immunity testing. For example the clamp may be capable of transmitting the associated injection current.

In one embodiment, the amplifier must be capable of supplying the total power required to simultaneously drive all of the test frequencies in the test frequency subset to provide sufficient field strength (e.g., the required field strength of a test standard). In one embodiment, the total power required to simultaneously drive all of the test frequencies in the test frequency subset may be less than total power available from the amplifier. For example, the total power required to simultaneously drive all of the test frequencies in the test frequency subset may be about 80% or less of the power output of the amplifier. Such a precaution may help to ensure that the amplifier is not in compression. Similar power limitations may be provided for some or all of the other components of the signal generator. For example, antennas, conductors, couplers, switches, and the like may be rated above the total power that is expected to pass through them to simultaneously drive all of the test frequencies in the test frequency subset.

In one embodiment, each test frequency subset may include test frequencies that should not interfere with any of the other frequencies when they are generated simultaneously. In one embodiment, no two frequencies may have a substantially similar wavelength. For example, in one embodiment, each of the quarter wavelengths of each of the test frequencies should have a difference of about 1%, 2%, 3%, 4%, 5%, 6%, 7%, 8%, 9%, 10%, 15% or more. In other words, the quarter wavelengths of each of the test frequencies should not be within about 1%, 2%, 3%, 4%, 5%, 6%, 7%, 8%, 9%, 10%, 15% or more, respectively, of the quarter wavelengths any of the other test frequencies in the test frequency subset. In one such embodiment, the wavelength of a test frequency may be defined as:

$$\text{wavelength} = \frac{c}{f} \quad (1)$$

wherein c is the speed of light (e.g., about $3\times10^8$ m/s) and f is the frequency of the test frequency, and the quarter wavelength is defined as:

$$\text{quarter\_wavelength} = \frac{\text{wavelength}}{4} \quad (2)$$

Accordingly, the quarter wavelength of a 100 MHz test frequency is about 0.75 m and the quarter wavelength of a 112 MHz wavelength is about 0.67 m. In one embodiment, a comparison of the quarter wavelengths for these two frequencies indicates a difference of 0.08 m that is about 11.9% of 0.67 m and 10.6% of 0.75 m. Because these frequencies have a difference that is greater than 10% of their frequencies, they may be tested simultaneously. In other words, they may both be included in the same test frequency subset.

In one embodiment, each test frequency subset may include test frequencies that do not include significant intermodulation products. In one embodiment, the sum of the intermodulation products must be smaller than the amplitude of the test frequencies of the test frequency subset. If the intermodulation products are significant at a frequency, they may reach a level in which they create an additional test tone at that frequency. For example, they may add to one another, producing an additional carrier frequency during testing. In one embodiment, the forward power of the intermodulation products associated with the test frequency set should be about given number of decibels (e.g., 6 dBm) less in amplitude than the test frequencies to ensure that they do not significantly contribute to the disturbance field. Moreover, a test frequency should not be included in a test frequency subset if it has the same frequency as an intermodulation product of one or more of other test frequencies of the test frequency set. In one exemplary embodiment in which a test frequency of 110 MHz and 112 MHz are in the test frequency set 202, and are being considered for inclusion in a test frequency subset, it is noted that intermodulation products may occur at 108 MHz and 114 MHz. Accordingly, if 110 MHz and 112 MHz test frequencies are included in the test frequency subset, test frequencies of 108 MHz and 114 MHz should not be included in the test frequency subset. Further, the significance of the modulation products that may occur at 108 MHz and 114 MHz, must be considered in view of other modulation products that may be the result of other test frequencies included in the test frequency subset. For example, if the test frequencies of 110 MHz, 112 MHz, 116 MHz and 118 MHz, are being considered for inclusion in a test frequency subset, it is noted that modulation products from the test frequencies 110 MHz and 112 MHz may occur at 108 MHz and 114 MHz, and additional modulation products from the test frequencies 116 MHz and 118 MHz may occur at 114 MHz and 120 MHz. Accordingly, the modulation products at 114 MHz should be summed and assessed to determine whether or not the resulting modulation product is significant with respect to the actual test frequencies. For example, if the modulation product is below about 6 dB less than the test frequencies, then the test frequencies in the subset may be satisfactory, however, if the modulation product is higher than about 6 dB less than the test frequencies, then the test frequencies in the subset may be unsatisfactory, and a one or more of the test frequencies may be removed from the test frequency subset. Such an approach may be repeated, e.g., adding, removing, and substituting test frequencies of the test frequency set to the test frequency subset, until the test frequency subsets do not have significant intermodulation products.

In accordance with the above described embodiments, assessing the test frequency subsets 210 may include, for each of the frequency subsets, assessing whether or not the system is physically capable of generating the given test frequencies simultaneously, assessing whether or not each of the test frequencies in the subsets has a wavelength that is sufficiently different from the wavelengths of each of the other test frequencies to prevent/minimize interference between each of the test frequencies when they are generated simultaneously, and assessing each of the test frequency subset to ensure that significant intermodulation products are not present when the test frequencies are generated simultaneously. Accordingly, each of the test frequency subsets 210 of the test frequency set 202 may include a subset of test frequencies that are capable of being provided by the system, that minimize interference and do not include significant intermodulation products when all of test frequencies of the test frequency subset are generated simultaneously.

In one embodiment, the test frequency subsets may include two or more subsets that include test frequencies of the test frequency set. For example, in one embodiment, the test frequency subsets 210 may include two or more test frequency subsets that include all of the test frequencies of the test frequency set. For example, in an embodiment of immunity testing that includes a sweep from 80 MHz to 1 GHz having two-hundred fifty-five test frequencies, as described above, each of the two-hundred fifty-five test frequencies are included in one of the test frequency subsets. In one embodiment, each of the test frequencies are included in only one of the test frequency subsets.

In one embodiment, method 200 also includes assessing a subset calibration set 214 based on calibration of subset field, as depicted at block 216. In one embodiment, calibrating a subset field includes calibrating and verifying that a generated field/injection current is sufficient when all of the frequencies in a test frequency subset are generated simultaneously. In one embodiment, calibrating the subset field includes operating the signal generator to generate fields/injection current with the test frequencies of the test frequency subset simultaneously and in accordance with the forward power levels recorded in calibration set 206 at step 208. In one embodiment, while generating the fields/injection current with the test frequencies of the test frequency subset simultaneously, the drive level of the signal generator (e.g., of the frequency synthesizer) is adjusted such that each generated test frequency has the substantially the same forward power levels associated with it in the calibration set 206. For example, in one embodiment, the signal generator is adjusted such that a forward power for the test frequencies of the test frequency subset being generated simultaneously, matches the forward power when measured with individual generation of test frequencies at block 208. Adjustment of the signal generator should be provided such that it does not overdrive the amplifier. For example, as described above, the total power required to simultaneously drive all of the test frequencies in the test frequency subset may be about 80% or less of the power output of the amplifier. Such a precaution may help to ensure that the amplifier is not in compression.

In one embodiment, a forward power for each generated frequency of the test frequency subset is verified, e.g., checked against the forward power measured for that given test frequency at block 208. In one embodiment, the forward power may be measured at an input of the transducer of the signal generator. For example, the forward power may be measured at the probe between the output of the amplifier and the input to the transducer (e.g., antenna) of the signal generator. In one embodiment, the same device used to measure forward power of individually generated frequencies, e.g., at calibration at block 208, should be used when measuring forward power during multi-field generation, e.g., at block 216. In one embodiment including radiated immunity testing, the receiver may include a field probe and/or the broadband antenna positioned in a similar manner as it was during calibration of the field at block 208. In an embodiment that includes conducted immunity testing, the receiver may include a similar device, e.g., the same current probe, used in a similar manner as it was during calibration of the field at block 208.

In one embodiment, calibrating the subset field (block 216) may include verifying that the settings of the signal generator (e.g., drive levels/forward power levels) derived during generation of the test frequency subsets simultaneously, the amplifier meets linearity standards. In one embodiment linearity of the amplifier can be verified by reducing the drive levels of the generator (e.g., reduced by 5.1 dB) to reduce the forward power of all of the generated test frequencies by a given amount while measuring the forward power to verify that the forward power was reduced by a similar amount (e.g., reduced by 5.1 dB to 3.1 dB). In one embodiment, the drive level may be measured prior to the generated signal reaching the amplifier, e.g., at the probe between an output of the signal generator and an input of the amplifier.

In one embodiment, calibrating the subset field includes adjusting the forward power level to a test level. For example, during calibration, standards may require that forward power levels be set to provide a field strength that is 1.8 times the target field strength required during actual testing. Accordingly, in one embodiment, a reduced forward power level is calculated that will provide the target field strength. During testing, the reduced forward power levels and drive levels associated with the target field strength, as opposed to the previously measured forward power levels, may be used.

In one embodiment, the resulting settings, e.g., drive levels, and associated forward power measurements and target field strength may be recorded in the subset calibration set 214, may be used for reference at a later time as discussed in more detail below.

Although the above embodiments are described with respect to a signal generator including a single signal generator/source, embodiments may include one or more signal generators using of multiple signal generators/source. In such an embodiment, the above described techniques would be performed in a similar manner, except for calibration adjustments may be performed on the multiple signal generators/sources.

In one embodiment, method 200 includes performing an immunity test, as depicted at block 218. In one embodiment, performing the immunity test includes subjecting the DUT to each of the test frequencies of the test frequency set. In one embodiment, the DUT is subjected to a plurality of the test frequencies simultaneously. In one embodiment, the generator is operated to generate test frequency sets in sequence. For example, in one embodiment, the signal generator is operated to subject the DUT to all of the test frequencies of one of the test frequency subsets simultaneously, followed by subjecting the DUT to all of test frequencies of another of the test frequency subsets simultaneously, and so on until the DUT has been subjected to all of the test frequency subsets 210, and has thus been subjected to all of the test frequencies of the test frequency set. In one embodiment, the signal generator is operated based on the subset calibration set 214. For example, the drive levels of the signal generator may be set based on the reduced forward power levels, as described above with respect to calibrating the subset field at block 216. In one embodiment, modulation (e.g., amplitude modulation) may be applied to the signals provided at the reduced forward power levels.

During testing operation of the DUT may be monitored to assess and determine whether or not any test frequencies of the test frequency set are affecting operation. In one embodiment, the signal generator is operated to subject the DUT to a test frequency subset. If the DUT continues to operate, the signal generator is operated subject the DUT to the next test frequency subset and so on until an error is detected or the DUT has been properly subjected to all of the test frequency subsets and/or test frequencies of the test frequency set. If an error is detected while subjecting the DUT to a test frequency subset, it may be indicative of an error due to one of the test frequencies within the test frequency subset. In one embodiment, the signal generator is operated to subject the DUT to each of the test frequencies in the DUT individually, one at a time. Such a procedure may enable a determination of which test frequency or test frequencies may generate errors for the DUT, or may expose that the errors are caused by a combination of the test frequencies being generated simultaneously; indicating that the DUT is not susceptible to errors when individually subjected to the test frequencies of the test frequency subset.

In one embodiment, if an error is detected while subjecting the DUT to a test frequency subset, the signal generator is operated to subject the DUT to a subset of test frequencies of the test frequency subset. In other words, the DUT is subjected to one or more subsets of the test frequency subset. Such a procedure may help to reduce the testing time associated with subjecting the DUT to each of the test frequencies in the test frequency subset individually, one at a time. For example, the initial test frequency subset that generated the error may be split into two or more subsets. In other embodiments, one or more of the two or more subsets may be further divided into subsets and so on. Such an embodiment may further reduce testing time. In one embodiment, each of the additional subsets may be calibrated with a procedure similar to that described above, such as those described with respect to blocks 204-218.

In one embodiment, method 200 may be performed in series or may be performed at separate times. For example, the initial steps (e.g., blocks 204-214) may be performed to setup a chamber for testing, and the test itself (e.g., blocks 218 and 220) may be performed during each test. In one such embodiment, the initial steps for setting up the chamber may be performed when the test setup is initially built, something in the test setup changes that may affect testing operation, during routine maintenance, and/or a calibration of the system is required. Accordingly, multiple test procedures may be performed between initial setup (e.g., calibrations).

Embodiments of the present invention may be involved with performing test and/or measurement functions; controlling and/or modeling instrumentation or industrial automation hardware; modeling and simulation functions, e.g., modeling or simulating a device or product being developed or tested, etc. Exemplary test applications include electromagnetic compatibility (EMC) immunity testing. However, it is noted that embodiments of the present invention can be used for a plethora of applications and is not limited to the above applications. In other words, applications discussed in the present description are exemplary only, and embodiments of the present invention may be used in any of various types of systems. Thus, embodiments of the system and method of the present invention is operable to be used in any of various types of applications, including generation of various signal types and frequencies. Moreover, application may include including the control and testing of various types of devices such as multimedia devices, video devices, audio devices, telephony devices, etc.

Although the embodiments above have been described in considerable detail, numerous variations and modifications will become apparent to those skilled in the art once the above disclosure is fully appreciated. It is intended that the following claims be interpreted to embrace all such variations and modifications. Furthermore, note that the word "may" is used throughout this application in a permissive sense (i.e., having the potential to, being able to), not a mandatory sense (i.e., must). The term "include", and derivations thereof, mean "including, but not limited to". As used in this specification, the singular forms "a", "an" and "the" include plural referents unless the content clearly indicates otherwise. Thus, for example, reference to "a transducer" includes a combination of two or more transducers. The term "coupled" means "directly or indirectly connected".

I claim:

1. A method of electromagnetic compatibility multi-carrier immunity testing, comprising:

generating a first carrier frequency set comprising a first plurality of carrier frequencies simultaneously, wherein one or more of the first plurality of carrier frequencies is substantially different from other ones of the first plurality of carrier frequencies such that the first plurality of carrier frequencies do not interfere with one another when they are generated simultaneously; and applying the first plurality of carrier frequencies simultaneously to a device under test, wherein intermodulation products of the first plurality of carrier frequencies are not significant relative to the first plurality of carrier frequencies when the first plurality of carrier frequencies are generated simultaneously.

2. The method of claim 1, further comprising:
providing an initial carrier frequency set comprising an initial plurality of carrier frequencies;
wherein the first carrier frequency set comprises a first subset of the initial plurality of carrier frequencies of the initial carrier frequency set;
comprising subjecting the device under test to the first plurality of carrier frequencies of the initial test carrier frequency set.

3. The method of claim 2, comprising providing a second carrier frequency set, comprising a second plurality of carrier frequencies configured to be generated simultaneously, wherein the second carrier frequency set comprise a second subset of the initial plurality of carrier frequencies of the initial carrier frequency set that is different from the first subset.

4. The method of claim 1, wherein quarter-wavelengths of each of the plurality of carrier frequencies of the first carrier frequency set is at least 1% different from each other carrier frequency of the plurality of carrier frequencies of the first carrier frequency set.

5. The method of claim 1, wherein the intermodulation products of the first plurality of carrier frequencies comprise a forward power amplitude at least 6 dB less than a forward power amplitude of each the first plurality of carrier frequencies when the first plurality of carrier frequencies are generated simultaneously.

6. The method of claim 1, wherein the intermodulation products do not act as an additional carrier frequency on the device under test when the first plurality of carrier frequencies are generated simultaneously.

7. The method of claim 1, comprising generating a second carrier frequency set, wherein the first carrier frequency set and the second carrier frequency set are generated in sequence.

8. The method of claim 1, wherein said generating comprises subjecting the device under test to the first plurality of carrier frequencies simultaneously in an anechoic chamber.

9. A non-transitory computer readable memory storage medium comprising program instructions for performing electromagnetic compatibility multi-carrier immunity testing, wherein the program instructions are executable to implement:
generating a first plurality of carrier frequencies simultaneously, wherein one or more of the plurality of carrier frequencies is substantially different from other ones of the first plurality of carrier frequencies such that the first plurality of carrier frequencies do not interfere with one another when they are generated simultaneously; and
applying the first plurality of carrier frequencies simultaneously to a device under test, wherein intermodulation products of the first plurality of carrier frequencies are not significant relative to the first plurality of carrier frequencies when the first plurality of carrier frequencies are generated simultaneously.

10. The non-transitory computer readable memory storage medium of claim 9,
wherein the memory medium stores an initial carrier frequency set comprising an initial plurality of carrier frequencies,
wherein the first plurality of carrier frequencies comprises a first subset of the initial plurality of carrier frequencies of the initial carrier frequency set.

11. The non-transitory computer readable memory storage medium of claim 10, wherein the program instructions are further executable to implement:
generating a second plurality of carrier frequencies simultaneously such that the device under test is subjected to the second plurality of carrier frequencies simultaneously, wherein the second plurality of carrier frequencies comprises a second subset of the initial plurality of carrier frequencies of the initial carrier frequency set that is different from the first subset.

12. An electromagnetic immunity testing system, comprising:
a generator that generates a plurality of carrier frequencies simultaneously, wherein quarter-wavelengths of one or more of the plurality of carrier frequencies are substantially different from quarter-wavelengths of others of the plurality of carrier frequencies such that the plurality of carrier frequencies do not interfere with one another when they are generated simultaneously;
wherein the generator applies the plurality of carrier frequencies simultaneously to a device under test, and wherein intermodulation products of the plurality of carrier frequencies are not significant relative to the plurality of carrier frequencies when they are generated simultaneously.

13. The system of claim 12, wherein quarter-wavelengths of each of the plurality of carrier frequencies of the first carrier frequency set is at least 1% different from each other carrier frequency of the plurality of carrier frequencies of the first carrier frequency set.

14. The system of claim 12, wherein the intermodulation products of the first plurality of carrier frequencies comprise a forward power amplitude at least 6 dB less than a forward power amplitude of each the first plurality of carrier frequencies when the first plurality of carrier frequencies are generated simultaneously.

15. The system of claim 12, wherein the electromagnetic immunity testing system comprises a radiated immunity test system or a conducted immunity test system.

16. A computer-implemented method of electromagnetic compatibility immunity testing, comprising:
assessing, by a computer, an initial forward power associated with a first carrier frequency of a plurality of carrier frequencies, wherein the initial forward power is configured to generate a field strength;
assessing, by the computer, a first subset of carrier frequencies of the plurality of carrier frequencies, wherein the first subset comprises the first carrier frequency, wherein the first carrier frequency is substantially different from others ones of the first plurality of carrier frequencies of the first subset such that the plurality of carrier frequencies of the first subset do not interfere with one another when the plurality of carrier frequencies of the first subset are generated simultaneously, and wherein intermodulation products of the first plurality of carrier frequencies of the first subset are not significant relative to the plurality of carrier frequencies of the first subset when the plurality of carrier frequencies of the first subset are generated simultaneously;
assessing, by the computer, a first adjusted drive level for the first carrier frequency, wherein assessing the adjusted drive level for the first carrier frequency comprises generating the first subset of carrier frequencies simultaneously and adjusting a drive level associated with the first carrier frequency to an first adjusted drive level configured generate the initial forward power associated with the first carrier frequency; and generating the first subset of carrier frequencies simultaneously, wherein generating the first subset of carrier frequencies simultaneously comprises generating the first carrier frequency using the first adjusted drive level to perform electromagnetic compatibility immunity testing of a device under test.

17. The method of claim 16, comprising assessing an initial forward power associated with a second carrier frequency of the plurality of carrier frequencies, assessing a second subset of carrier frequencies of the plurality of carrier frequencies wherein the second subset comprises the second carrier frequency, assessing a second adjusted drive level for the second carrier frequency, and generating the second subset of carrier frequencies simultaneously using the second adjusted drive level, wherein the first subset of carrier frequencies and the second subset of carrier frequencies are generated at different times such that their respective durations do not overlap.

18. The method of claim 16, wherein each of the plurality of carrier frequencies of the first subset of carrier frequencies has a quarter-wavelength that is at least 1% different from quarter-wavelengths of each other of the plurality of carrier frequencies of the first subset of carrier frequencies.

19. The method of claim 16, wherein the intermodulation products of the plurality of carrier frequencies of the first subset of carrier frequencies comprise a forward power amplitude at least 6 dB less than a forward power amplitude of each of the plurality of carrier frequencies of the first subset of carrier frequencies when the plurality of carrier frequencies of the first subset of carrier frequencies are generated simultaneously.

20. The method of claim 16, wherein generating the first subset of carrier frequencies simultaneously using the adjusted drive level comprises subjecting a device under test to the first subset of carrier frequencies simultaneously.

* * * * *